United States Patent
Sofianos et al.

(10) Patent No.: US 7,158,603 B2
(45) Date of Patent: Jan. 2, 2007

(54) METHOD AND APPARATUS FOR COMPENSATING DEVIATION VARIANCES IN A 2-LEVEL FSK FM TRANSMITTER

(75) Inventors: Paul B. Sofianos, Gilbert, AZ (US); David W. Feldbaumer, Chandler, AZ (US); Darren V. Weninger, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 796 days.

(21) Appl. No.: 10/330,852

(22) Filed: Dec. 26, 2002

(65) Prior Publication Data

US 2004/0125904 A1 Jul. 1, 2004

(51) Int. Cl.
*H03D 3/24* (2006.01)
*H03L 7/06* (2006.01)

(52) U.S. Cl. ............... 375/376; 375/374; 375/375; 327/156

(58) Field of Classification Search ............... 375/376, 375/375, 374, 373, 371, 354, 295, 302, 303, 375/306, 377; 327/141, 155, 156, 157; 455/260; 331/17, 10, 9, 1 R, 18, 25; 332/127, 126, 332/123, 117, 129
See application file for complete search history.

(56) References Cited

U.S. PATENT DOCUMENTS

| | | | |
|---|---|---|---|
| 5,483,203 A | 1/1996 | Rottinghaus | |
| 5,495,206 A | 2/1996 | Hietala | |
| 5,557,244 A | 9/1996 | Salvi | |
| 5,850,164 A * | 12/1998 | Mellot | 331/177 R |
| 5,912,926 A | 6/1999 | Koenck et al. | |
| 5,952,892 A * | 9/1999 | Szajda | 331/57 |
| 6,016,332 A * | 1/2000 | Smith et al. | 375/376 |
| 6,133,797 A | 10/2000 | Lovelace et al. | |
| 6,552,617 B1 * | 4/2003 | Griffith et al. | 331/10 |
| 6,990,164 B1 * | 1/2006 | Bushman et al. | 375/376 |
| 2001/0015677 A1 * | 8/2001 | Choi | 331/11 |
| 2003/0103591 A1 * | 6/2003 | Noguchi | 375/376 |

FOREIGN PATENT DOCUMENTS

| | | |
|---|---|---|
| EP | 0 961 412 A1 | 5/1998 |
| WO | WO 99/07065 | 2/1999 |
| WO | WO 02/067428 A2 | 8/2002 |

* cited by examiner

*Primary Examiner*—Tesfaldet Bocure
*Assistant Examiner*—Vineeta Panwalkar
(74) *Attorney, Agent, or Firm*—Ingrassia Fisher & Lorenz

(57) ABSTRACT

A dual-port voltage control oscillator for use in a frequency synthesizer has first and second input ports and an output. The first port is coupled in a phase-locked-loop configuration for receiving input data and a reference frequency. The phase-locked-loop tunes the oscillator in response to a channel selection and trim parameter. The second port of the oscillator has a variable gain characteristic. A multiplier is coupled to the second port for multiplying the input data by a transfer function to alter the input data thereby compensating for the second port variable gain characteristic.

15 Claims, 3 Drawing Sheets

METHOD AND APPARATUS FOR COMPENSATING DEVIATION VARIANCES IN A 2-LEVEL FSK FM TRANSMITTER

TECHNICAL FIELD

This invention relates generally to frequency modulated (FM) transmitters, and more particularly, to a method and apparatus for compensating deviation variances that arise as a dual-port frequency synthesizer is tuned over its operating frequency range.

BACKGROUND OF THE INVENTION

A phase-locked-loop (PLL) is an electronic circuit having a voltage or current driven oscillator that is continuously adjusted to match in phase, and thus lock onto, the frequency of a reference signal. PLLs are frequently used in wireless communication systems, particularly where information is transmitted using frequency modulation (FM) (i.e. a method of impressing data onto an alternating-current wave by varying the instantaneous frequency of the wave).

A PLL generally consists of a voltage-controlled oscillator (VCO) that is tuned, for example, by means of a capacitive and inductive tank circuit. A phase comparator, charge pump, and low-pass-filter feedback loop enables the VCO to seek and lock onto a desired frequency based on a reference frequency. If the VCO frequency departs from the selected reference frequency, the phase comparator, in conjunction with the charge pump and low-pass-filter produces an error voltage that is applied to the VCO's tuning system to bring the VCO back to the reference frequency. The PLL, VCO, reference signal, charge pump, low-pass-filter, and phase comparator together with programmable divider in the feedback loop comprise what is commonly referred to as a frequency synthesizer.

In the case of a typical single-port VCO, the center frequency ($f_c$) of the VCO output is modulated by applying varying input data to the programmable divider. The divider output and a reference signal having a frequency ($F_{REF}$) is then applied to a phase detector that compares the phase of the reference signal with the phase of the divider output and applies a phase error signal to a loop low pass filter after processing by the charge pump. The voltage or current output of the filter is applied to the single VCO input to tune the VCO to the desired frequency.

Unfortunately, the single port modulation approach may not be suitable for high speed data applications; e.g. when the input data rate exceeds the PLL's natural loop frequency. For example, if the digital input data is changing at a rate of 1 megabit per second, and the loop response is, for example, 40 kHz, the loop response will filter out the changing data, and the modulation characteristics will be altered. Such is the case in a high data-rate frequency-shift keying (FSK) system. FSK is a method of transmitting digital signals having two binary states; i.e. a logic 0 (low) and a logic 1 (high), each of which is represented by a variance in frequency from $f_c$. That is, a logic 0 is represented by a wave-form at a first specific frequency, and a logic 1 is represented by a wave-form at a different frequency.

A dual-port VCO includes a second modulation port for receiving an analog version of the input data thus combining a low pass response and a high pass response. This type of dual-port modulation permits modulation at frequencies well above the natural loop frequency. Thus, a certain degree of flexibility is achieved with regard to establishing the bandwidth of the main port loop without sacrificing input data rate. The architectures of single-port and dual-port synthesizers are well known, and further discussion is not deemed necessary. However, the interested reader is referred to U.S. Pat. No. 5,557,244 issued Sep. 11, 1996 and entitled "Dual-Port Phase and Magnitude Balance Synthesizer and Modulator and Method for Transceiver" and U.S. Pat. No. 5,912,926 issued Jun. 15, 1999 and entitled "Method of an Apparatus for Controlling Modulation of Digital Signals in Frequency Modulated Transmissions".

FSK FM transmitters are designed to operate over a specific frequency band comprised of a plurality (e.g. 80) of different frequency channels each having a center frequency and upper and lower frequency limits. This specific frequency band is within the tuning range of a dual-port VCO of the type described above, and a dual-port synthesizer may be utilized to tune the VCO's output to desired channels. The VCO will then modulate the output carrier around the center frequency of the specific channel to which it is tuned.

It is desirable that the deviation of frequency about the center frequency of each channel be substantially constant over the specific frequency band. To accomplish this, the VCO's second port gain should remain constant over the operating range of the VCO. In practice, however, the gain associated with the second port (measured in frequency per volt; i.e. MHz/volt) is not constant but is in fact center frequency sensitive. That is, the second port VCO gain varies as the VCO is tuned over its operating band. This variation in the second port gain characteristic results in different changes in the instantaneous carrier frequency for substantially similar modulation voltages for different channels. For example, a desired deviation from the center frequency of each channel may be 170 kHz. Applying a specific modulation voltage to the VCO's second port to achieve this deviation may result in 120 kHz deviation in one channel and a 250 kHz deviation in another channel.

Several approaches have been utilized to avoid the problems associated with a varying second port gain characteristic. An entirely different architecture may be employed. That is, a single-port architecture may be utilized thus eliminating the problems associated with second port gain characteristics. Unfortunately, the benefits of high data-rate and low power consumption associated with dual-port VCOs are also eliminated. Alternatively, mechanical or electronic tuning devices may be employed. However, such devices would have to be incorporated into each unit significantly adding to production costs. Still another approach involves tightening process parameters during the manufacture of the VCO to reduce the VCO's second port gain variability across its frequency band. This likewise increases production costs and renders manufacturing significantly more complex. It should also be obvious that if the VCO is operated over a very narrow frequency band, the problems associated with variable second port gain characteristics are not significant. Unfortunately, certain applications require operation over a wide frequency band. For example, to satisfy the BLUETOOTH standard, the VCO must operate over an 80 MHz bandwidth.

It should therefore be appreciated that it would be desirable to provide a method and apparatus for compensating for deviation variances over the operating band of an FSK FM transmitter utilizing a dual-port VCO.

BRIEF DESCRIPTION OF THE DRAWINGS

The following drawings are illustrative of particular embodiments and therefore do not limit the scope of the invention, but are presented to assist in providing a proper understanding. The drawings are intended for use in conjunction with the explanations in the following detailed description. The present invention will hereinafter be described in conjunction with the appended drawings, wherein like reference numerals denote like elements and.

DETAILED DESCRIPTION OF THE EXEMPLARY EMBODIMENT

The following description is exemplary in nature and is not intended to limit the scope, applicability, or configuration of the invention in anyway. Rather, the following description provides a convenient illustration for implementing an exemplary embodiment of the invention. Various changes to the described embodiment may be made in the function and arrangement of the elements described herein without departing from the scope of the invention.

Figure 1:
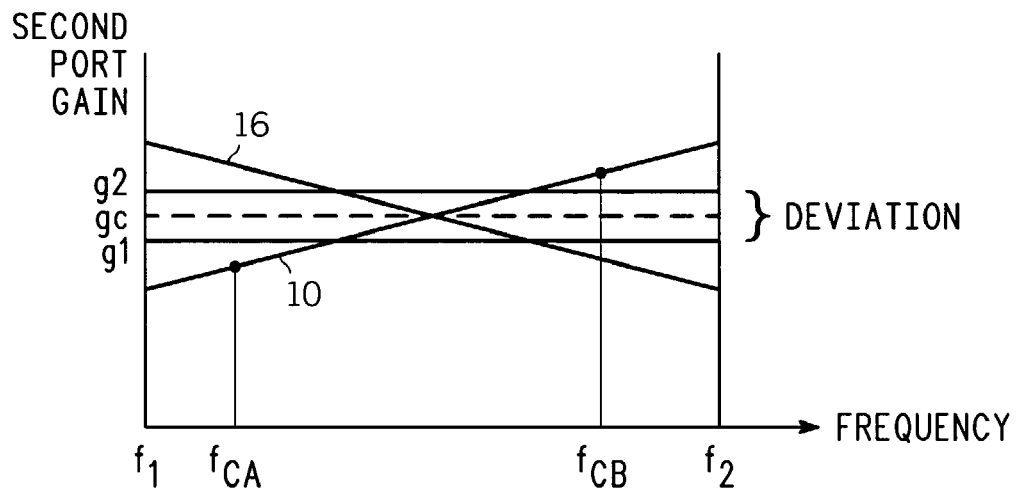
FIG. 1 illustrates a variable second-port gain characteristic of a VCO over its operating frequency band.
Figure 2:
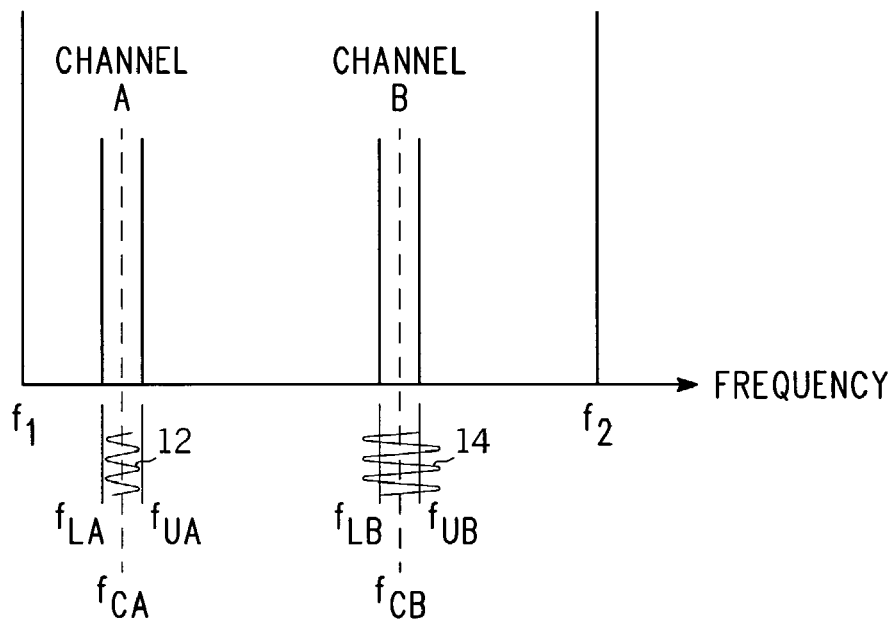
FIG. 2 illustrates deviation variances occurring in two channels within the operating band of a VCO due to the VCO's second port gain characteristic shown in FIG. 1.

Referring to FIG. 1 and FIG. 2, the operating frequency band of a dual-port VCO is shown as having a lower frequency limit ($f_1$) and an upper frequency ($f_2$). As stated previously, the operating band includes a plurality of channels only two of which are shown in FIG. 2 as Channel-A and Channel-B. As can be seen, Channel-A has a lower frequency limit $f_{LA}$, an upper frequency limit $f_{UA}$, and a first center frequency $f_{CA}$. Channel-B has a lower frequency limit $f_{LB}$, an upper frequency limit $f_{UB}$, and a center frequency $f_{CB}$.

As stated previously, ideally the VCO's second port gain characteristic remains relatively constant over the operating frequency band of the VCO such that a constant voltage swing applied to the VCO's second port results in the same variation of frequency at the VCO's output over the operating frequency band. Referring to FIG. 1, an acceptable second port gain deviation is illustrated as having a lower limit $g_1$, an upper limit $g_2$ and a center $g_c$. Unfortunately, the second port VCO gain characteristic is not constant but is frequency sensitive across the operating band of the VCO. Thus, substantially similar modulation voltages are accompanied by different VCO gains. That is, while the deviation from the center frequency of each channel should remain relatively constant, it will in fact vary as a function of frequency (channel) as a result of the variable second port gain over the VCO's operating band. For example, in a given situation, the second port gain characteristic may be an increasing linear function as it is shown at 10 in FIG. 1. Since the gain at the center frequency ($f_{CA}$) of Channel-A resides below the acceptable gain deviation shown in FIG. 1, the frequency deviation about center frequency $f_{CA}$ may be less than desired as it is shown at 12 in FIG. 2. In contrast, the second port gain characteristic at the center frequency ($f_{CB}$) of Channel-B resides above the acceptable gain deviation, and the frequency deviation in Channel-B may exceed the desired frequency deviation as it is shown in 14 in Channel-B.

The solution to this problem involves the application of an inverse transfer function of the true second port characteristic to the data which is ultimately applied in a form of a modulation voltage to the second port of the VCO. This inverse transfer function is shown graphically as line 16 in FIG. 1. It should be appreciated that while the second port gain characteristic is shown in FIG. 1 as being a linear function which increases with frequency, the second port gain characteristic may include second and higher order components. In such cases, an appropriate inverse transfer function having second and higher order components would be utilized. However, for the sake of simplicity of explanation, the remainder of the description of the inventive apparatus and method will be directed to a linear second port gain characteristic of the type shown at 10 in FIG. 1.

Figure 3:
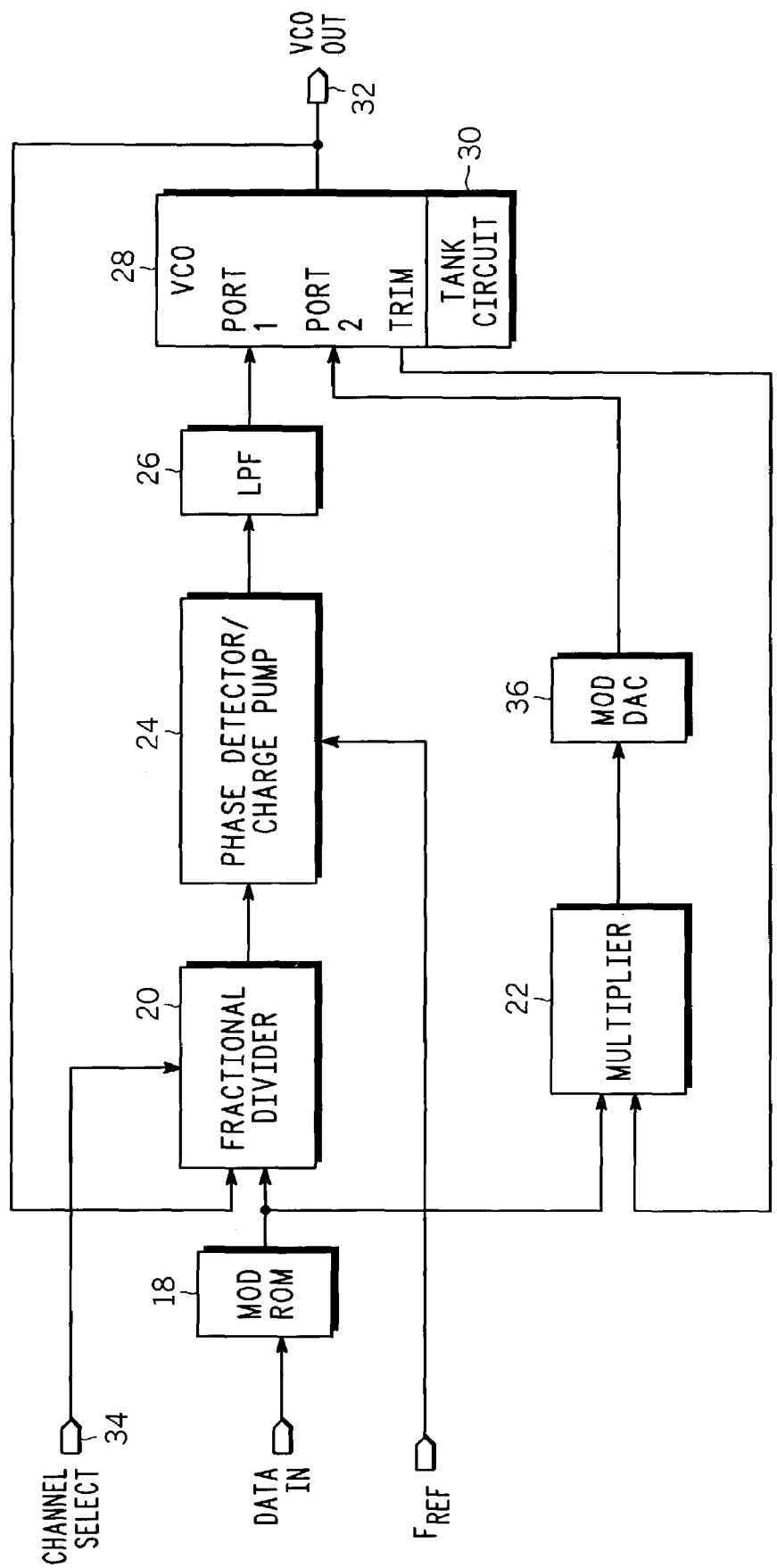
FIG. 3 is a simplified block diagram of a dual-port PLL architecture in accordance with the teachings of the present invention.

FIG. 3 is a block diagram of a dual-port PLL architecture in accordance with the teachings of the present invention. Referring to FIG. 3, input data (DATA IN) is applied to a modulating ROM circuit 18 having an output which is coupled to fractional divider 20 and to multiplier 22. Modulating ROM 18 receives digital input data and in this embodiment, converts it to an over-sampled Gaussian filtered representation of the input data stream.

Fractional divider 20 has a first input coupled to the output of modulator ROM 18, a second input coupled to output 32 of VCO 28, and a third input coupled to receive a channel select signal 34. Fractional divider 20 has a division ratio that is varied with time such that the effective division ratio may be varied in non-integer steps. The output of fractional divider 20 is applied to an input of phase detector/charge pump 24. A second input of phase detector/charge pump 24 is couple to receive a signal having a reference frequency ($F_{REF}$). The output of phase detector/charge pump 24 is proportional to the phase error between the reference signal and the output of fractional divider 20. The charge pump provides pulses for charging or discharging low pass filter (LPF) 26 which in turn generates an output voltage that is applied to port 1 of VCO 28. Finally, the output 32 of VCO 28 represents the synthesized output, thus completing the phase lock loop. VCO 28 is provided with a tank circuit 30 of the type shown in FIG. 5 (to be discussed further hereinbelow). VCO 28 is course tuned across its operating frequency band in discrete steps by altering the capacitance of tank circuit 30 utilizing a trim algorithm known to those skilled in the art.

The structure described thus far comprises a dual-port synthesizer well known to those skilled in the art. However, for further discussion of phase-locked-loop synthesizers including fractional dividers and a dual-port VCO which is coarsely tuned by means of a capacitive tank circuit in accordance with an established trim algorithm, the interested reader is directed to U.S. Pat. No. 5,557,244 issued Sep. 17, 1996 and entitled "Dual-Port Phase and Magnitude Balanced Synthesizer Modulator and Method for a Transceiver", U.S. Pat. No. 6,133,797 issued Oct. 17, 2000 and entitled "Self-Calibrating VCO Correction Circuit and Method of Operation", and U.S. Pat. No. 5,495,206 issued Feb. 27, 1996 and entitled "Fractional N Frequency Synthesis with Residual Error Correction and Method Thereof", the teachings of which are hereby incorporated by reference.

Referring again to FIG. 3, the output of modulator ROM 18 is applied to a first input of multiplier 22. Also applied to an input of multiplier 22 is a trim signal from VCO 28 which is representative of the trim result or parameter generated by the internal tank circuit and trim algorithm necessary to achieve the currently selected channel center frequency.

Thus, a different trim parameter may be applied to multiplier 22 for each channel. Multiplier 22 utilizes the trim parameter of VCO 28 to apply a transfer function on the output of modulator ROM 18 which in inversely related to the second port gain characteristic as described previously.

The operation of multiplier 22 will be described in more detail in connection with FIG. 4. As stated previously, a linear second port gain characteristic has been chosen to explain the invention. Thus, the inverse transfer function applied to multiplier 22 will take the form of a linear equation; i.e. y=mx+b where y represents a transfer function which compensates the output of modulator ROM 16 so as to substantially reduce the problems described above in connection with a non-constant second port gain function.

Figure 4:
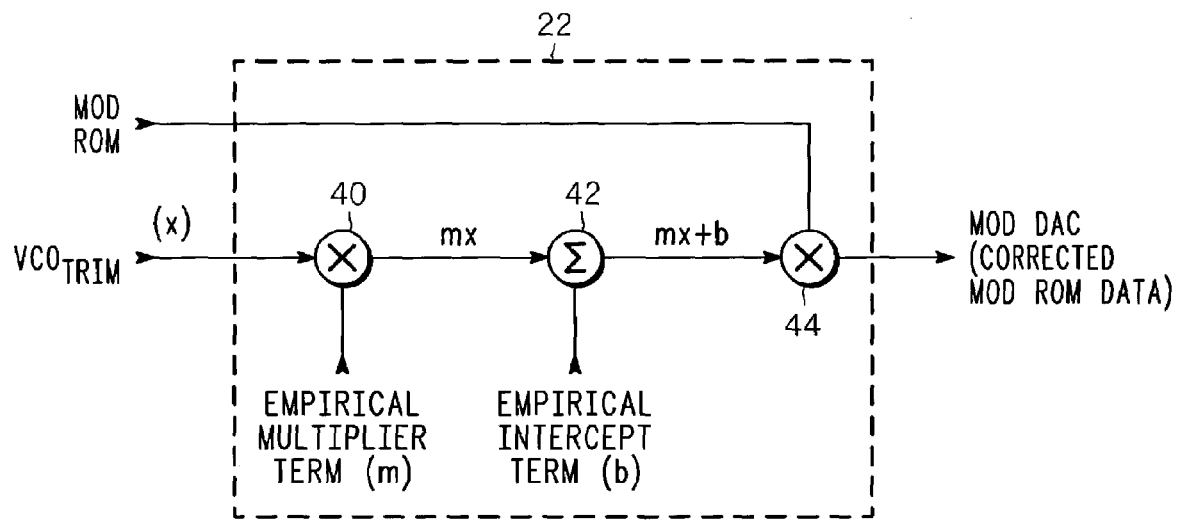
FIG. 4 is a simplified schematic diagram of a multiplier for use in the system shown in FIG. 3.

Referring to FIG. 4, it can be seen that the variable trim parameter X determined by the VCO trim algorithm is fed back to a first input of multiplier circuit 40. The second input of multiplier circuit 40 receives a multiplier term (m) which is empirically determined by testing many devices. That is, through laboratory testing, the slope (m) of the inverse transfer function is determined and is applied as an input to multiplier circuit 40. The output (mx) of multiplier circuit 40 is applied to a first input of adder 42. An empirically determined intercept term (b) is applied to a second input of adder 42. The resulting inverse transfer function is applied to a first input of multiplier 44, and the output of modulator ROM 18 is applied to a second input of multiplier 44. In this manner, the signal which appears at the output of multiplier 44 and is applied to the input of digital-to-analog converter (MOD DAC) 36 has been corrected or scaled in an appropriate direction so as to neutralize the deleterious impact of the non-constant second port gain characteristic. Referring back to FIG. 3, a voltage signal output from digital-to-analog converter 36 modulates the second port of VCO 28 and therefore the output carrier.

Figure 5:
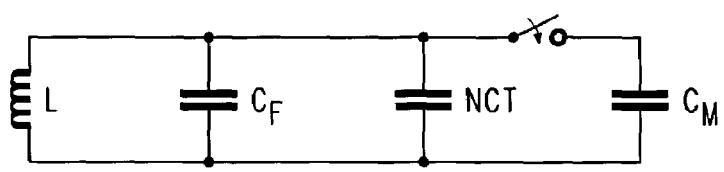
FIG. 5 is a simplified schematic diagram of a tank circuit utilized in the VCO shown in FIG. 3.

FIG. 5 is a schematic diagram of one example of a simplified tank circuit suitable for use in the dual-port VCO shown in FIG. 3. The total inductance of the circuit is represented by inductor L, and $C_F$ represents the circuit's fixed capacitance. The gross trim capacitance of the circuit is represented by $NC_T$ where the variable N is the number of trim capacitors utilized to set the coarse frequency of VCO 28 and is directly related to the parameter x in FIG. 4. A more detailed discussion of the use of capacitive tank circuits for tuning a VCO can be found in the above referenced U.S. Pat. No. 6,133,797.

Thus, there has been provided a method and apparatus for compensating for variances in the second port gain of a dual-port voltage controlled oscillator. The invention has been described with reference to a specific embodiment. However, it should be appreciated that various modifications and changes can be made without departing from the scope of the invention as set forth in the appended claims. Accordingly, the specification figures should be regarded as illustrative rather than restrictive, and all such modifications are intended to be included within the scope of the present invention.

What is claimed is:

1. A frequency synthesizer, comprising:
a dual-port voltage controlled oscillator having first and second input ports and an output, said first input port coupled in a phase-locked-loop configuration that receives input data and a reference frequency, said second input port having a variable gain characteristic and configured to tune said oscillator in response to a trim parameter received from said oscillator; and
a multiplier coupled to said second input port for multiplying said input data by a transfer function to alter said input data thereby compensating for said variable gain characteristic.

2. The synthesizer according to claim 1 wherein said multiplier receives said trim parameter to form said transfer function.

3. A frequency synthesizer, comprising:
a dual-port voltage controlled oscillator having first and second input ports and an output, said first input port coupled in a phase-locked-loop configuration that receives input data and a reference frequency, said second input port having a variable gain characteristic and configured to tune said oscillator in response to a trim parameter, and
a multiplier coupled to said second input port for multiplying said input data by a transfer function to alter said input data thereby compensating for said variable gain characteristic, wherein said multiplier comprises:
a first multiplying circuit for multiplying said trim parameter by an empirically derived multiplier term to produce a first term of said transfer function, wherein said multiplier receives said trim parameter to form said transfer function;
a summing circuit for summing said first term of said transfer function with an empirically derived intercept term to produce a second term of said transfer function; and
a second multiplying circuit for multiplying said input data by said transfer function.

4. The synthesizer according to claim 2 wherein said variable gain characteristic is a function of frequency and wherein said transfer function is inversely related to said variable gain characteristic.

5. A frequency synthesizer, comprising:
a dual-port voltage controlled oscillator having first and second input ports and an output, said first input port coupled in a phase-locked-loop configuration that receives input data and a reference frequency, said second input port having a variable gain characteristic and configured to tune said oscillator in response to a trim parameter; and
a multiplier coupled to said second input port for multiplying said input data by a transfer function to alter said input data thereby compensating for said variable gain characteristic, wherein said gain characteristic is a first substantially linear function and said transfer function is a second linear function inversely related to said first linear function.

6. The synthesizer according to claim 5 wherein said second linear function takes the form y=mx+b where x is said trim parameter, and m and b are empirically determined constants.

7. The synthesizer according to claim 3 wherein said phased-locked-loop comprises:
a divider having a first input coupled to said input data, a second input coupled to the output of said oscillator, and a third input configured to receive a channel select signal;
a phase detector and charge pump having a first input coupled to an output of said divider and having a second input coupled to a reference frequency; and
a low pass filter having an input coupled to an output of said phase detector and charge pump and having an output coupled to said first port.

8. The synthesizer according to claim 7 wherein said divider is a fractional divider.

9. The synthesizer according to claim 8 further comprising a modulation circuit having an input coupled to receive said input data and having an output coupled to said divider and to said multiplier.

10. The synthesizer according to claim 9 further comprising a digital-to-analog converter having input coupled to the output of said multiplier and having an output coupled to said second port.

11. A frequency synthesizer for use in a dual-port frequency modulated transmitter of the type which comprises a tunable voltage oscillator having a first port for tuning and frequency modulating said oscillator and a second port for frequency modulating said oscillator, comprising:

a multiplier having first and second inputs and having an output, said multiplier receiving digital data input signals at a first input thereof and receiving a feedback signal from said oscillator at a second input thereof said feedback signal being representative of the modulation characteristics at the first port of said oscillator, said multiplier being responsive to said feedback signal for providing a transfer function which when multiplied with the said data signals generates corrected digital data signals at said output thereof for modifying the modulation signal applied to said second port thereby altering any FM deviation variance as the oscillator is tuned across a predetermined tuning range; and a digital-to-analog converter coupled to said multiplier and said second port for converting said corrected digital data signals to an analog signal.

12. The dual-port synthesizer according to claim 11 wherein said multiplier comprises:

a first multiplying circuit for multiplying said feedback signal by an empirically derived multiplier term to produce a first term of said transfer function;

a summing circuit for summing said first term of said transfer function with an empirically derived intercept term to produce a second term of said transfer function; and a second multiplying circuit for multiplying the digital data signals by said transfer function.

13. A method for compensating for deviation variances in a frequency synthesizer of the type that includes a voltage control oscillator having a first port and a second port, the method comprising:

automatically providing feedback information about the modulation characteristics of said oscillator to a multiplier coupled to said oscillator as said oscillator is tuned, said feedback information including a trim parameter produced by said oscillator, automatically scaling the modulation applied to the second port in response to said feedback information to alter FM deviation variances across the tuning range of said oscillator, and tuning said oscillator in response to said feedback information.

14. The method according to claim 13 wherein the step of automatically scaling the modulation characteristics of said oscillator further includes the step of altering digital input information by applying to said digital input information a transfer function which is inversely related to a second port gain characteristic of said oscillator.

15. The synthesizer according to claim 1, wherein said oscillator comprises a tank circuit, and wherein said tank circuit generates said trim parameter.

\* \* \* \* \*

UNITED STATES PATENT AND TRADEMARK OFFICE
CERTIFICATE OF CORRECTION

| | | |
|---|---|---|
| PATENT NO. | : 7,158,603 B2 | Page 1 of 1 |
| APPLICATION NO. | : 10/330852 | |
| DATED | : January 2, 2007 | |
| INVENTOR(S) | : Paul B. Sofianos et al. | |

It is certified that error appears in the above-identified patent and that said Letters Patent is hereby corrected as shown below:

Column 7, line 17, "thereot" should be changed to --thereof--;

Signed and Sealed this

Twenty-seventh Day of February, 2007

JON W. DUDAS
*Director of the United States Patent and Trademark Office*